United States Patent
Wang

(10) Patent No.: US 9,520,845 B2
(45) Date of Patent: Dec. 13, 2016

(54) SUPPLY MODULATION FOR RADIO FREQUENCY POWER AMPLIFICATION

(71) Applicant: Microsoft Corporation, Redmond, WA (US)

(72) Inventor: Zhancang Wang, Beijing (CN)

(73) Assignee: Microsoft Technology Licensing, LLC, Redmond, WA (US)

( * ) Notice: Subject to any disclaimer, the term of this patent is extended or adjusted under 35 U.S.C. 154(b) by 69 days.

(21) Appl. No.: 14/543,021

(22) Filed: Nov. 17, 2014

(65) Prior Publication Data

US 2016/0142013 A1    May 19, 2016

(30) Foreign Application Priority Data

Nov. 14, 2014    (CN) .......................... 2014 1 0640376

(51) Int. Cl.
| | | |
|---|---|---|
| H03G 3/20 | (2006.01) | |
| H03F 3/04 | (2006.01) | |
| H03F 3/19 | (2006.01) | |
| H03F 1/02 | (2006.01) | |
| H03F 3/24 | (2006.01) | |

(52) U.S. Cl.
CPC ............... *H03F 3/19* (2013.01); *H03F 1/025* (2013.01); *H03F 1/0222* (2013.01); *H03F 3/245* (2013.01); *H03F 2200/102* (2013.01); *H03F 2200/451* (2013.01); *H03F 2200/511* (2013.01)

(58) Field of Classification Search
CPC ................................... H03G 3/20; H03F 3/04
USPC .................................................. 330/127, 297
See application file for complete search history.

(56) References Cited

U.S. PATENT DOCUMENTS

| | | | |
|---|---|---|---|
| 7,706,467 B2 | 4/2010 | Kenington | |
| 8,718,579 B2 | 5/2014 | Drogi | |
| 8,958,498 B1 * | 2/2015 | Lee ......................... | H03F 1/025 332/103 |

(Continued)

FOREIGN PATENT DOCUMENTS

| | | |
|---|---|---|
| EP | 2367282 A2 | 9/2011 |
| GB | 2498391 A | 7/2013 |

OTHER PUBLICATIONS

"International Search Report & Written Opinion Issued in PCT Application No. PCT/US2015/059801", Mailed Date Jan. 19, 2016, 13 Pages.

(Continued)

*Primary Examiner* — Patricia T Nguyen
(74) *Attorney, Agent, or Firm* — Tom Wong; Micky Minhas; Zete Law, P.L.L.C.

(57) ABSTRACT

The subject matter described herein relates to supply modulation for power amplification. In one embodiment, the voltage level of the envelope with a tunable threshold voltage. The high level part of the envelope above the threshold voltage is maintained and amplified, for example, by the linear amplification process. On the other hand, the low level part of the envelope is replaced with the constant low voltage level. In amplification, the shaped low level part can be prompted to the predefined low supply voltage which may be directly output to the RFPA. By eliminating complicated amplification process on the lower level part of the envelope, the efficiency and bandwidth of the supply modulation can be improved and the circuitry can be simplified, without introducing any timing mismatch or delays.

20 Claims, 5 Drawing Sheets

(56) References Cited

U.S. PATENT DOCUMENTS

| | | |
|---|---|---|
| 2005/0227644 A1 | 10/2005 | Maslennikov et al. |
| 2007/0249304 A1 | 10/2007 | Snelgrove et al. |
| 2008/0024214 A1* | 1/2008 | Kim .................. H03C 1/36 330/136 |
| 2010/0227577 A1* | 9/2010 | Zeong ................ H03F 1/0211 455/127.2 |
| 2011/0058601 A1 | 3/2011 | Kim et al. |
| 2011/0148705 A1* | 6/2011 | Kenington ............ H03F 3/68 342/372 |
| 2011/0151806 A1* | 6/2011 | Kenington ............ H01Q 3/28 455/101 |
| 2011/0285460 A1* | 11/2011 | Murao ................ H04B 1/0483 330/124 R |
| 2012/0275544 A1 | 11/2012 | Midya et al. |
| 2012/0302179 A1* | 11/2012 | Brobston ............ H03F 1/0266 455/73 |
| 2013/0093247 A1 | 4/2013 | Park et al. |
| 2013/0109441 A1 | 5/2013 | Lorenz et al. |
| 2013/0207731 A1 | 8/2013 | Balteanu |
| 2014/0028370 A1 | 1/2014 | Wimpenny |
| 2014/0167843 A1 | 6/2014 | Asensio et al. |
| 2014/0235185 A1* | 8/2014 | Drogi .................. H04B 1/0475 455/114.2 |

OTHER PUBLICATIONS

Kim, et al., "High Efficiency and Wideband Envelope Tracking Power Amplifier with Sweet Spot Tracking", In IEEE Radio Frequency Integrated Circuits Symposium, May 23, 2010, 4 pages.

Wang, Zhancang, "Envelope Tracking Power Amplifier for Wireless Communications", In Proceedings of Artech House, May 31, 2014, 3 pages.

Second Written Opinion Issued in PCT Application No. PCT/US2015/059801, Mailed Date: Sep. 16, 2016, 5 Pages.

* cited by examiner

– 1 –

SUPPLY MODULATION FOR RADIO FREQUENCY POWER AMPLIFICATION

RELATED APPLICATIONS

This application claims priority to Chinese Application No. 201410640376.9, filed on Nov. 14, 2014, and entitled "SUPPLY MODULATION FOR RADIO FREQUENCY POWER AMPLIFICATION." This application claims the benefit of the above-identified application, and the disclosure of the above-identified application is hereby incorporated by reference in its entirety as if set forth herein in full.

BACKGROUND

With development of the wireless communication, there are more and more demands for various data services in mobile environments. The fourth generation ("4G") and beyond wireless communication standards allow higher transmission rate and wider bandwidth. In the meantime, the peak to average power ratio ("PAPR") of the signals is relatively high. Generally speaking, high PAPR will put negative impact on the efficiency of radio frequency ("RF") power amplifier ("RFPA") and thus degrade the system performance.

Envelope tracking ("ET") and envelope elimination and restoration ("EER") have been proposed in order to provide high efficiency of RFPA. Power supply modulation is an important factor for the RFPA. The RF envelope can be tracked and input into a power supply modulator. According to the RF envelope, the modulator provides dynamic supply output into the RFPA so as to amplify the RF signal adaptively. In order to perform efficient and effective signal amplification, especially to the signals with high PARA, there is a need in art for a power supply modulation solution which is capable of providing high efficiency and bandwidth without increasing the circuitry complexity of the modulator.

SUMMARY

Conventional RFPA does not increase the efficiency at the high average output power region for signals with high PARA and therefore is not suitable for 4G and beyond communication standards. Advanced RFPA techniques based on the instantaneous output power levels have been proposed. However, known power supply modulators suffer from timing alignment difficulty, for example, due to the parallel running of the linear amplification and switch stages. As a result, the efficiency and linearity will be reduced in wider bandwidth operation. Moreover, known modulators usually rely on a sinking part in the switch stage which causes additional power dissipation.

Embodiments of the subject matter described herein provide a supply modulation solution for RFPA. Given the envelope of the RF signal, the voltage level of the envelope may be compared with a tunable threshold voltage. If the envelope voltage is greater than or equal to the threshold voltage, the analog envelope will be maintained. The unchanged, analog high level part of the envelope may be amplified, for example, by the linear amplification or any other suitable process.

On the other hand, if the voltage of the envelope is below the threshold voltage, the envelope voltage may be replaced with predefined low voltage which can be the ground level in one embodiment. That is, the constant low voltage can be used for all the envelope values below the threshold voltage. As a result, the low level part of the envelope will be shaped as trough pulse supply. In envelope amplification stage, the shaped low level part of the envelope is increased to predefined low supply voltage which may be directly output into the RFPA, without subject to any complicated amplification process.

In this way, efficiency of the envelope amplification in the supply modulator can be improved by eliminating complicated amplification process on the lower level part of the envelope. Further, the switch part in conventional solutions is no longer needed. As a result, the circuitry complexity of the supply modulator can be significantly reduced. In addition, the amplifier and a switch for controlling the amplifier are arranged in series to directly provide the modulator output. Therefore, contrary to conventional supply modulators where the linear amplification and switch stages operate in parallel, embodiments of the subject matter described herein are free of timing mismatch. This reduces the delays between different stages and improves the linearity and efficiency of the power supply modulation. Furthermore, in accordance with embodiments of the subject matter described herein, it is possible to process much wider bandwidth envelope signal.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

DETAILED DESCRIPTION

The subject matter described herein will now be discussed with reference to several example embodiments. It should be understood these embodiments are discussed only for the purpose of enabling those skilled persons in the art to better understand and thus implement the subject matter described herein, rather than suggesting any limitations on the scope of the subject matter.

As used herein, the term "includes" and its variants are to be read as opened terms that mean "includes, but is not limited to." The term "or" is to be read as "and/or" unless the context clearly indicates otherwise. The term "based on" is to be read as "based at least in part on." The term "one embodiment" and "an embodiment" are to be read as "at least one embodiment." The term "another embodiment" is to be read as "at least one other embodiment." Other definitions, explicit and implicit, may be included below.

Figure 1:
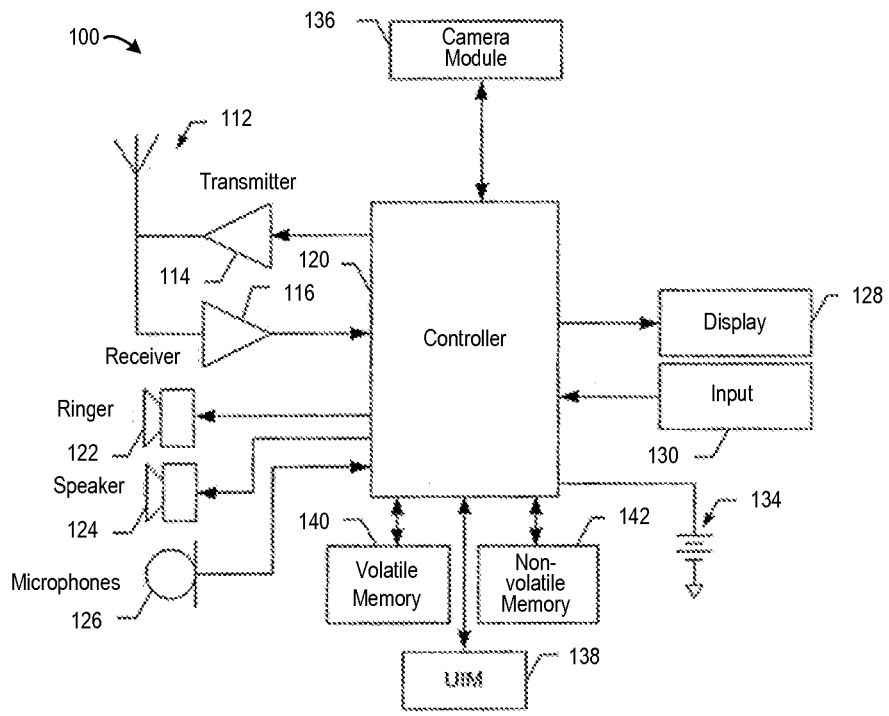
FIG. 1 illustrates a block diagram of a device in which one embodiment of the subject matter described herein can be implemented.

FIG. 1 illustrates a block diagram of a device 100 in accordance with one embodiment of the subject matter described herein. In one embodiment, the device 100 may be user equipment (UE). Examples of the user equipment include, but are not limited to, a Mobile Terminal (MT), a Subscriber Station (SS), a Portable Subscriber Station (PSS), a Mobile Station (MS), an Access Terminal (AT), a pager, a mobile computer, a mobile TV, a game apparatus, a laptop, a tablet computer, a camera, a video camera, a GPS device, and other types of voice and textual communication system. A fixed-type device may likewise easily use embodiments of the subject matter described herein.

As shown, the device 100 comprises one or more antennas 112 operable to communicate with the transmitter 114 and the receiver 116. With these devices, the device 100 may perform cellular communications with one or more BSs and/or any other entities such another UE. Specifically, in accordance with embodiments of the subject matter described herein, the device 100 comprises a RFPA (not shown) to amplify the RF signals. Moreover, the device 100 supports the ET processing to track the envelope of the RF signals. The tracked envelope may be fed into a supply modulator (not shown) such that the supply modulator provides dynamic output to the RFPA according to the envelope.

The device 100 further comprises at least one controller 120. It should be understood that the controller 120 comprises circuits or logic required to implement the functions of the device 100. For example, the controller 120 may comprise a digital signal processor, a microprocessor, an A/D converter, a D/A converter, and/or any other suitable circuits. The control and signal processing functions of the device 100 are allocated in accordance with respective capabilities of these devices.

Optionally, the device 100 may further comprise a user interface, which, for example, may comprise a ringer 122, a speaker 124, a microphone 126, a display 128, and an input interface 130, and all of the above devices are coupled to the controller 120. The device 100 may further comprise a camera module 136 for capturing static and/or dynamic images.

The device 100 may further comprise a battery 134, such as a vibrating battery set, for supplying power to various circuits required for operating the device 100 and alternatively providing mechanical vibration as detectable output. In one embodiment, the device 100 may further comprise a user identification module (UIM) 138. The UIM 138 is usually a memory device with a processor built in. The UIM 138 may for example comprise a subscriber identification module (SIM), a universal integrated circuit card (UICC), a universal user identification module (USIM), or a removable user identification module (R-UIM), etc. The UIM 138 may comprise a card connection detecting apparatus according to embodiments of the subject matter described herein.

The device 100 further comprises a memory. For example, the device 100 may comprise a volatile memory 140, for example, comprising a volatile random access memory (RAM) in a cache area for temporarily storing data. The device 100 may further comprise other non-volatile memory 142 which may be embedded and/or movable. The non-volatile memory 142 may additionally or alternatively include for example, EEPROM and flash memory, etc. The memory 140 may store any item in the plurality of information segments and data used by the device 100 so as to implement the functions of the device 100. For example, the memory may contain machine-executable instructions which, when executed, cause the controller 120 to implement the method described below.

It should be understood that the structural block diagram in FIG. 1 is shown only for illustration purpose, without suggesting any limitations on the scope of the subject matter described herein. In some cases, some devices may be added or reduced as required.

Figure 2:
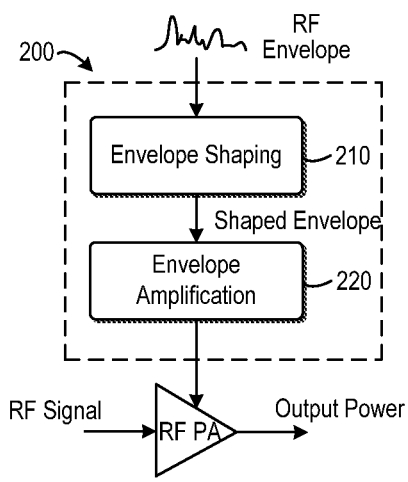
FIG. 2 illustrates a block diagram of a supply modulator in accordance with one embodiment of the subject matter described herein.

FIG. 2 illustrates a high-level block diagram of a supply modulation for RFPA in accordance with one embodiment of the subject matter described herein. As shown, in general, the supply modulator 200 includes an envelope shaping stage 210 and an envelope amplification stage 220. Each of the stages can be implemented by one or more hardware, software and/or firmware components.

By means of the ET processing, the envelope of RF signals may be obtained. Any suitable ET technologies, either already known or to be developed in the future, can be used in connection with embodiments of the subject matter described herein. The tracked envelope of the RF signals may be input into the envelope shaping stage 210, where the envelope is shaped. Then the shaped envelope is fed to the envelope amplification stage 220 for envelope amplification. The amplified envelope is input into the RFPA to amplify the RF signals. Due to the envelope tracking and modulation, the output power of the RFPA can be optimized.

In accordance with embodiments of the subject matter described herein, at the envelope shaping stage 210, the envelope is shaped based on its voltage. In one embodiment, the envelope shaping stage 210 may include a comparator (not shown). In operation, if the voltage of the RF envelope is greater than or equal to a predefined voltage level, then such high level part of the envelope will be maintained as analog voltage. That is, at the shaping stage 210, the high level part of the envelope is kept unchanged.

On the other hand, if the voltage of the envelope is below the threshold voltage, then the shaping may be done by replacing the envelope with predefined low voltage. Such low voltage may be a constant, low enough voltage level. For example, the low voltage is below the predetermined lower threshold voltage. By replacing the analog low level part of the envelope with the low voltage, the resulting shaped low level part of the envelope will be trough shape pulse.

Specifically, in one embodiment, the low voltage used to replace the initial low level part of the envelope may be zero voltage. In this embodiment, if the voltage of the envelope is determined to be below the threshold voltage, then the envelope shaping stage 210 may directly cut off to the ground level. In this way, the envelope shaping can be done efficiently.

Figure 3:
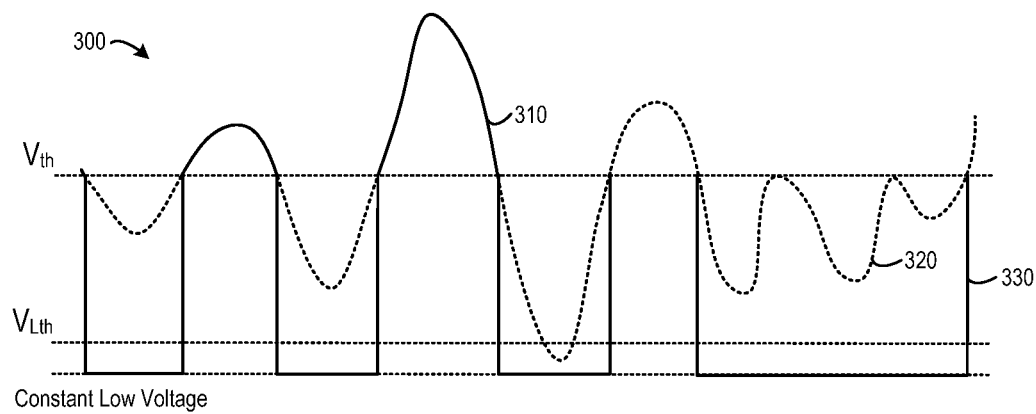
FIG. 3 illustrates a schematic diagram of envelope shaping in accordance with one embodiment of the subject matter described herein.

FIG. 3 shows a schematic diagram of the envelope shaping in accordance with embodiments of the subject matter described herein. As shown, the predefined threshold voltage $V_{th}$ is used to divide the envelope 300 into a high level part 310 and a low level part 320. The threshold voltage $V_{th}$ may be selected and/or updated according to relevant factors according to one or more properties of the device. For example, in one embodiment, it is possible to dynamically determine the PRPA of the RF signal and update the threshold voltage $V_{th}$ based on the determined PRPA. For example, when the PRPA is relatively high, the threshold voltage $V_{th}$ can be increased. Accordingly, a large part of the envelope may be replaced with the constant low voltage, thereby improving the efficiency of the envelope modulation and RFPA.

The high level part 310 will be maintained in the analog form. On the contrary, the initial low level part 320 will be replaced with the constant low voltage which is below the lower threshold voltage ($V_{Lth}$). It can be seen that $V_{Lth}$ is lower than the threshold voltage $V_{th}$. In one embodiment, the low voltage may be set as the ground level, as discussed above. In this way, the shaped envelope is composed of two parts 310 and 330. The shaped high level part 310 is the initial high level part of the envelope, while the shaped low level part 330 is trough shape pulse.

It is to be understood that although the envelope 300 shown in FIG. 3 contains both the high level part and the low level part, it is only for the purpose of illustration without suggesting any limitations to the scope of the subject matter described herein. It is possible that the envelope only contain the high level part or low level part.

Still with reference to FIG. 2, at the envelope amplification stage 220, the shaped envelope may be amplified based on its voltage, thereby achieving the envelope modulation. In general, in accordance with embodiments of the subject matter described herein, the analog high level part and pulse low level part of the envelope are amplified separately. That is, different amplification approaches are applied on the high level parts and low level parts.

More specifically, for the high level part of the shaped envelope where the envelope voltage is greater than or equal to the threshold voltage ($V_{th}$), envelope amplification process may be applied. To this end, an envelope amplifier may be used to amplify the unchanged part 310 of the envelope.

By way of example, in one embodiment, a linear amplifier may be used to apply linear amplification process on the unchanged high level part of the envelope. In one embodiment, the linear amplification may be done with reference to a supply voltage level. For the sake of discussion, the supply voltage used in the linear amplification of the high level part of the envelope is referred to as "high supply voltage" and denoted as "$V_H$." The high supply voltage $V_H$ is high enough. Specifically, the high supply voltage $V_H$ is at least greater than the threshold voltage ($V_{th}$).

It is to be understood that the use of linear amplifier/amplification is only for the purpose of illustration without suggesting any limitations to the scope of the subject matter described herein. Any suitable amplification processes, either currently known or to be developed in the future, and their associated amplifier can be used in the envelope amplification stage 220 to amplify the high level part of the envelope.

The low envelope part, which is of the trough shape, is amplified in a different way. In one embodiment, the constant low voltage may be directly increased to or replaced by supply voltage which is low. For the sake of discussion, such supply voltage is referred to as "low supply voltage" and denoted as "$V_L$." It would be appreciated that the low supply voltage is greater than the low voltage of the low level part of the shaped envelope. For example, in one embodiment, the low supply voltage is greater than the lower threshold voltage $V_{Lth}$. Of course, it is to be understood that the low supply voltage is still relatively low voltage. For example, the low supply voltage is below the threshold voltage $V_{th}$.

Specifically, in one embodiment, the low supply voltage $V_L$ may be set by taking one or more properties of the device 100 into consideration. By way of example, in one embodiment, the low supply voltage $V_L$ is greater than the keen voltage or cut-in voltage of the RFPA in the device 100. As known, the keen voltage refers to the forward voltage at which the current through the RFPA starts increasing rapidly. If the envelope input to the RFPA is below the knee voltage, it will introduce serious distortions and memory effect which are difficult to be linearized. By use of the low supply voltage $V_L$ above the knee voltage, it is possible to guarantee that the RFPA operation is far away from the knee voltage region.

Figure 4:
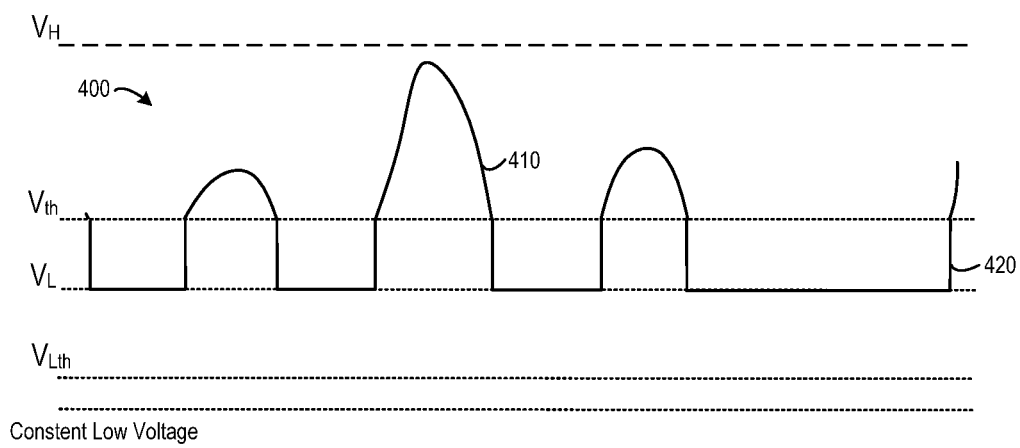
FIG. 4 illustrates a schematic diagram of envelope amplification in accordance with one embodiment of the subject matter described herein.

FIG. 4 shows a schematic diagram of the envelope amplification in accordance with one embodiment of subject matter described herein. As described above, the high level part 310 is amplified, for example, by linear amplification process with reference to the high supply voltage $V_H$. It can be seen that the high supply voltage $V_H$ is greater than the voltage threshold $V_{th}$. The amplification process results in the amplified high level part 410.

The low level part is amplified by replacing the constant low voltage with the low supply voltage $V_L$ which may be greater than the knee voltage of the RFPA in one embodiment, for example. As a result, in the amplified envelope 400, the pulse 330 obtained by the shaping stage 210 (shown in FIG. 3) is amplified as the pulse 420 of the low supply voltage $V_L$, without subject to any complicated amplification process.

It would be appreciated that in accordance with embodiments of the subject matter described herein, the envelope amplifier such as the linear amplifier does not work all the time. Instead, by using the low fixed supply voltage for all envelope values below the threshold voltage, it is only necessary for the amplifier to process the high level part of the envelope. Hence the envelope amplifier can run in intervals to enhance the modulation efficiency by eliminating low level envelope amplification process. Specifically, in one embodiment, the low supply voltage $V_L$ may be directly fed into the RFPA, for example, by a power switch. In this way, the modulation efficiency can be further improved.

Figure 5:
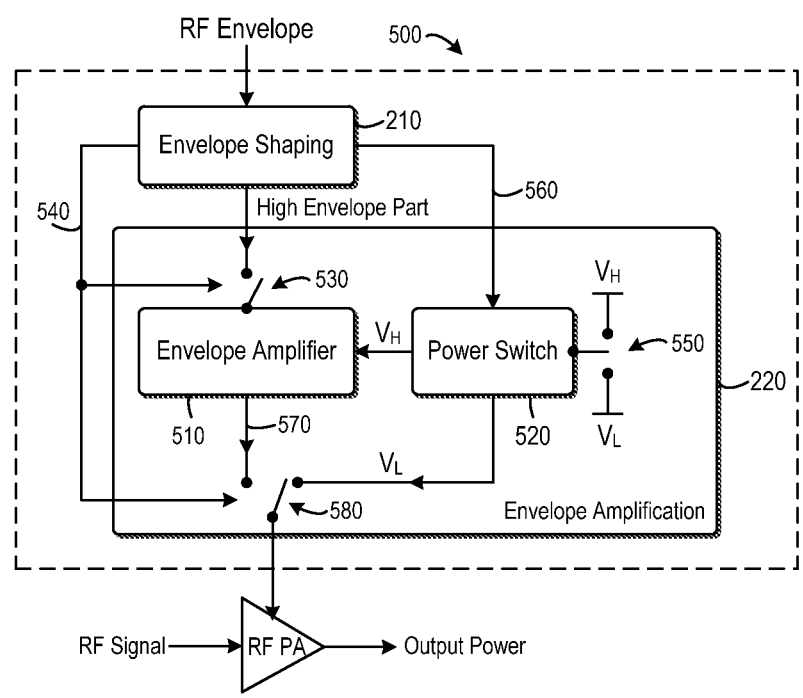
FIG. 5 illustrates a block diagram of an apparatus for modulating the envelope of RF signals in accordance with one embodiment of the subject matter described herein.

FIG. 5 shows a block diagram of a supply modulator 500 in accordance with embodiments of one embodiment of the subject matter described herein. The modulator 500 can be considered as an implementation of the apparatus 200 shown in FIG. 2. As shown, the supply modulator 500 comprises the envelope shaping stage 210 which has been discussed with reference to FIG. 2 and will be not repeated.

In the shown embodiment, the envelope amplification stage 220 in the supply modulator 500 comprises an envelope amplifier 510 and a power switch 520. The amplifier 510 is configured to only amplify the high level part of the envelope with the voltage greater than the threshold voltage ($V_{th}$). Specifically, a switch 530 is coupled between the envelope shaping stage 210 and the envelope amplifier 510. The switch 530 may be driven by a control signal 540 from the envelope shaping stage 210.

In operation, if the voltage of the envelope is greater than or equal to $V_{th}$, the envelope will be kept unchanged and output from the envelope shaping stage 210, as described above. At this point, the envelope shaping stage 210 outputs a control signal 540 to close the switch 530, such that the high level part of the envelope is input into the envelope amplifier 510. Additionally, the envelope shaping stage 210 outputs another control signal 560 to the power switch 520 which in turn couples the high supply voltage $V_H$ to the envelope amplifier 530 via a switch 550. It is to be understood that although the control signals 540 and 560 are shown as separate signals, they can be implemented as the same control signal and output from a single terminal of the envelope shaping stage 210.

The envelope amplifier 510 applies amplification process, such as linear amplification, on the unchanged high level part of the envelope with reference to the high supply voltage $V_H$. Then the envelope amplifier 510 outputs the amplified envelope 570. The control signal 540 drives the switch 580, such that the output signal 570 of the envelope amplifier 510 is coupled to RFPA. As such, the amplified high level envelope 570 is output as the modulated envelope to the RFPA.

If the voltage of the envelope is greater than or equal to $V_{th}$, the envelope shaping stage 210 replaces the envelope voltage with the constant low voltage, such as the zero voltage. At this point, the envelope shaping stage 210 may output the control signal 540 to open the switch 530, such that the envelope amplifier 510 is disconnected from the envelope shaping stage 210 and thus is bypassed. The envelope shaping stage 210 further controls the power switches 520 via the control signal 560, such that the low supply voltage $V_L$ is coupled to the switch 580 through the switch 580 and the power switch 520. The switch 580, which is also driven by the control signal 540, directly output the low supply voltage $V_L$ to the RFPA. In this way, the low level part of the envelope is modulated in a quite efficient way.

Figure 6:
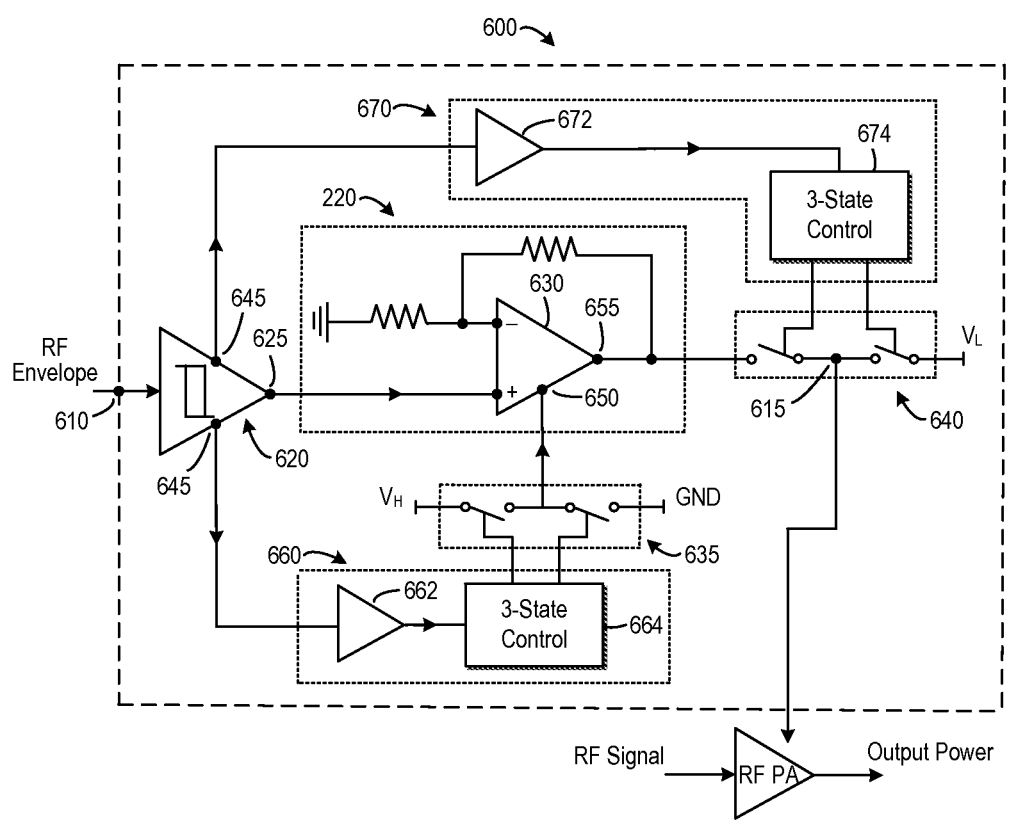
FIG. 6 illustrates a block diagram of circuitry of a supply modulator in accordance with one embodiment of the subject matter described herein.

FIG. 6 shows a block diagram of circuitry of a supply modulator 600 that can be used to implement the supply modulator, such as the modulator 500, in accordance with embodiments of the subject matter described herein. It is to be understood that the circuitry shown in FIG. 6 is described only for the purpose of illustration, without suggesting any limitations to the scope of the subject matter described herein.

As shown, the supply modulator 600 comprises an input node 610 and an output node 615. A comparator 620 is coupled to the input node 610 and has a voltage output 625. The comparator 620 may function as the envelope shaping stage 210. In one embodiment, the comparator 620 is operable to compare voltage of the envelope of RF signals that is received from the input node 610 with the threshold voltage ($V_{th}$). If the voltage of the envelope is greater than or equal to the threshold voltage, the comparator 620 outputs the unchanged, analog high level part of the envelope via the voltage output 625. If the voltage of the envelope is below the threshold voltage, the comparator 620 outputs constant low voltage via the voltage output 625. By way of example, in one embodiment, the constant low voltage may be zero voltage. As a result, in the signal provided via the voltage output 625, the high level part is analog voltage while the low level part is trough shape pulse.

The envelope amplification stage 220 includes an amplifier 630 which is coupled between the comparator 625 and the output node 615. The amplifier 630 can be enabled or disabled based on outcome of the comparison performed by the comparator 620. When enabled, the amplifier 630 is operable to amplify the unchanged high level part of the envelope that is received from the voltage output 625 of the comparator 620, as described above. The amplified envelope is provided via the output 655.

Additionally, the supply comparator 600 comprises a first switch 635 and a second switch 640. The first switch 635 is coupled between the comparator 620 and the amplifier 630. The first switch 635 is operable to enable or disable the amplifier 630 based on the comparison by the comparator 620. The second switch 640 is coupled to the comparator 620, the amplifier 630 and the output node 615. The second switch 640 is operable to connect, based on the comparison by the comparator 620, the output node 615 to the output 655 of the amplifier 630 or the low power supply $V_L$. As described above, in one embodiment, low power supply $V_L$ is greater than knee voltage of the RFPA coupled to the output node 615 of the supply modulator 600.

In one embodiment, driving of the first and second switches 635 and 640 may be implemented by the control signals provided by the comparator 620. Specifically, in this embodiment, the comparator 620 may have one or more control outputs 645. It is to be understood that although two outputs 645 are shown in FIG. 6, this is just for the purpose of illustration. The control signal can be output from a single control output.

In operation, if the voltage of the envelope is greater than or equal to the threshold voltage, the comparator 620 provides a first control signal via the control output 645. In response to the first control signal, the first switch 635 is driven to connect a reference voltage input 650 of the amplifier 630 to the high supply voltage $V_H$, and the second switch 640 is driven to connect the output node 615 to the output 655 of the amplifier 630. As a result, the high level part of the envelope is amplified by the amplifier 630 and the amplified envelope is output to the RFPA.

If the voltage of the envelope is below the threshold voltage, the comparator 620 provides the second control signal, which is different from the first control signal, via the control output 645. In response to the second control signal, the first switch 635 is driven to connect the reference voltage input 650 of the amplifier 630 to the ground, thereby bypassing the amplifier 630. In response to the second control signal, the second switch 640 is driven to connect the output node 615 to the low supply voltage $V_L$. As a result, the voltage $V_L$ may be directly output from the supply modulator 600 without any complicated amplification process on the low level part of the envelope, thereby improving the modulation efficiency and bandwidth.

In one embodiment, as shown in FIG. 6, the first and second switches 635 and 640 may be driven by respective switch driving stages. Specifically, the supply modulator 600 comprises a first switch driving stage 660 for the first switch 635 and a second switch driving stage 670 for the second switch 640. In one embodiment, the first and/or second control signals provided by the comparator 620 are digital signals. In this embodiment, the switch driving stage 660 may comprise a digital signal amplifier 662 for amplifying the digital control signal which is provided via the control output 645 of the comparator 620. The amplified control signal may be fed to three-state control logic 664 which drives the first switch 635 to couple the reference voltage input 650 of the envelope amplifier 630 to the high supply voltage $V_H$ or ground. The structure and functionality of the second switch driving stage 670 may be the same as those of the first driving stage 660. That is, the second switch driving stage 670 may comprise a digital signal amplifier 672 and three-state control logic 674.

Any suitable circuitry devices, either currently known or to be developed in the future, can be used to implement the modules in the supply modulator 600. For example, in one implementation, two-stage operational amplifier may serve as linear gain block and pulse shaping generator pulse amplifier. The bias diode may provide reference bias voltage for switch mode linear stage. The switching operation of linear amplification stage is realized by switching its bias reference voltage. An N-type power MOSFET device to performance the linear power amplification. As a simplified implementation, a schottky power diode may be used to select the $V_{th}$ and $V_L$.

Figure 7:
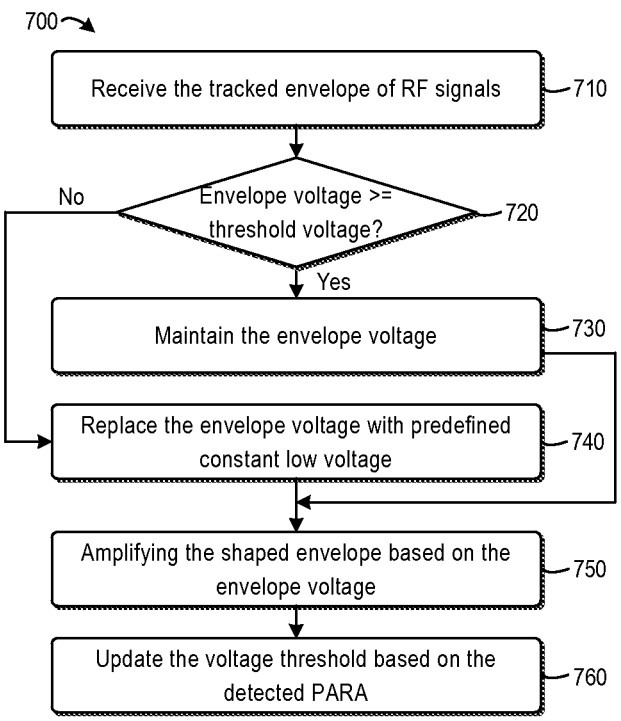
FIG. 7 illustrates a flowchart of a method for modulating the envelope of RF signals in accordance with one embodiment of the subject matter described herein.

FIG. 7 shows a flowchart of a method 700 for supply modulation in accordance with one embodiment of the subject matter described herein. The method 700 is entered at step 710 the envelope of RF signals received. The envelope of the RF signals may be obtained, for example, by ET processing.

Then it is determined at step 720 whether the voltage of the envelope is greater than or equal to the threshold voltage. If so, the method 700 proceeds to step 730 where the envelope is maintained for amplification. If the voltage of the envelope is below the threshold voltage, the method 700 proceeds to step 740 where the voltage of the envelope is replaced with predefined low voltage that is below lower threshold voltage.

At step 750, the shaped envelope is amplified based on the voltage of the envelope, wherein the amplified envelope is to be provided to a RF power amplifier (PA) for amplifying the RF signal. In particular, in one embodiment, if the voltage of the envelope is greater than or equal to the threshold voltage, the shaped envelope is amplified by applying envelope amplification process on the unchanged voltage of the envelope. In one embodiment, the linear envelope amplification may be applied on the unchanged voltage of the envelope with reference to high supply voltage that is greater than upper threshold voltage.

On the other hand, if the voltage of the envelope is below the threshold voltage, at step 750, the shaped envelope may be amplified by increasing the predefined low voltage to low supply voltage that is greater than the lower threshold voltage. In one embodiment, the predefined low voltage is zero voltage, and the low supply voltage is greater than knee voltage of the RFPA. Specifically, in one embodiment, the low supply voltage may be directly fed to the RFPA with the envelope amplifier bypassed.

In one embodiment, at optional step 760, the threshold voltage ($V_{th}$) may be updated according to the detected PAPR of the RF signal. In this way, it is possible to dynamically and adaptively optimize the efficiency and bandwidth of the supply modulator and the RFPA according to the RF signal characteristics.

For the purpose of illustration, some example embodiments have been described above. It would be appreciated that in accordance with embodiments of the subject matter described herein, the envelope amplifier does not amplify the traditional analog envelope with low efficiency. Instead, by pseudo trough shaping envelope processing and amplifying the pseudo trough envelope by switching on/off power supply, the power is saved. Moreover, by using constant low supply voltage for all envelope values below threshold values, the envelope amplifier only needs to process the high level part of the envelope. As a result, the amplifier can run in intervals to enhance efficiency by eliminating low level envelope amplification process. In addition, the PARA can be kept low while maintaining high amplification efficiency.

Furthermore, it can be seen that in accordance with embodiments of the subject matter described herein, the traditional switcher part is no longer needed. Instead, a power switch may be used to feed the high supply voltage $V_H$ and low supply voltage $V_L$ to the envelope amplifier and the supply modulator output, respectively and directly. In practice, the power switch can be implemented a simple switch to provide $V_H$ to envelope amplifier and $V_L$ to the modulator output according to the control signal generated from small signal switch stage. The elimination of switch mode power supply (SMPS) for combining significantly reduces the circuitry complexity of the supply modulator for mobile devices.

Moreover, it can be seen that the envelope amplifier and the switch can be arranged in serial to provide outputs directly to the modulator output. Compared with conventional solutions where the linear and switch operate in parallel and all the time and therefore the outputs have to be merged to the summing node to obtain the final output, embodiments of the subject matter described herein are free of any timing alignment difficulties. This allows the supply modulator to process much wider bandwidth envelope signal. The impacts of delays between stages are minimized, and the linearity and efficiency are also improved due to the elimination of the timing mismatches. Besides, by shaping the low level part of the envelope, the power dissipation for the subsequent power handling blocks can be reduced.

The functionally described herein can be performed, at least in part, by one or more hardware logic components. For example, and without limitation, illustrative types of hardware logic components that can be used include Field-programmable Gate Arrays (FPGAs), Application-specific Integrated Circuits (ASICs), Application-specific Standard Products (ASSPs), System-on-a-chip systems (SOCs), Complex Programmable Logic Devices (CPLDs), and the like.

Various embodiments of the subject matter described herein may be implemented in hardware or special purpose circuits, software, logic or any combination thereof. Some aspects may be implemented in hardware, while other aspects may be implemented in firmware or software which may be executed by a controller, microprocessor or other computing device. While various aspects of embodiments of the subject matter described herein are illustrated and described as block diagrams, flowcharts, or using some other pictorial representation, it will be appreciated that the blocks, apparatus, systems, techniques or methods described herein may be implemented in, as non-limiting examples, hardware, software, firmware, special purpose circuits or logic, general purpose hardware or controller or other computing devices, or some combination thereof.

By way of example, embodiments of the subject matter can be described in the general context of machine-executable instructions, such as those included in program modules, being executed in a device on a target real or virtual processor. Generally, program modules include routines, programs, libraries, objects, classes, components, data structures, or the like that perform particular tasks or implement particular abstract data types. The functionality of the program modules may be combined or split between program modules as desired in various embodiments. Machine-executable instructions for program modules may be executed within a local or distributed device. In a distributed device, program modules may be located in both local and remote storage media.

Program code for carrying out methods of the subject matter described herein may be written in any combination of one or more programming languages. These program codes may be provided to a processor or controller of a general purpose computer, special purpose computer, or other programmable data processing apparatus, such that the program codes, when executed by the processor or controller, cause the functions/operations specified in the flowcharts and/or block diagrams to be implemented. The program code may execute entirely on a machine, partly on the machine, as a stand-alone software package, partly on the machine and partly on a remote machine or entirely on the remote machine or server.

In the context of this disclosure, a machine readable medium may be any tangible medium that may contain, or store a program for use by or in connection with an instruction execution system, apparatus, or device. The machine readable medium may be a machine readable signal medium or a machine readable storage medium. A machine readable medium may include but not limited to an electronic, magnetic, optical, electromagnetic, infrared, or semiconductor system, apparatus, or device, or any suitable combination of the foregoing. More specific examples of the machine readable storage medium would include an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing.

Further, while operations are depicted in a particular order, this should not be understood as requiring that such operations be performed in the particular order shown or in sequential order, or that all illustrated operations be performed, to achieve desirable results. In certain circumstances, multitasking and parallel processing may be advantageous. Likewise, while several specific implementation details are contained in the above discussions, these should not be construed as limitations on the scope of the subject matter described herein, but rather as descriptions of features that may be specific to particular embodiments. Certain features that are described in the context of separate embodiments may also be implemented in combination in a single embodiment. Conversely, various features that are described in the context of a single embodiment may also be implemented in multiple embodiments separately or in any suitable sub-combination.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

I claim:

1. A method comprising:
   comparing voltage of envelope of a radio frequency (RF) signal with threshold voltage;
   responsive to the voltage of the envelope being greater than or equal to the threshold voltage, shaping the envelope by keeping the envelope unchanged;
   responsive to the voltage of the envelope being below the threshold voltage, shaping the envelope by replacing the voltage of the envelope with predefined low voltage, the predefined low voltage being below the threshold voltage; and
   amplifying the shaped envelope, the amplified envelope provided to a radio frequency power amplifier (RFPA) for amplifying the RF signal.

2. The method of claim 1, wherein amplifying the shaped envelope comprises:
   responsive to the voltage of the envelope being greater than or equal to the threshold voltage, amplifying the shaped envelope by applying an envelope amplification process on the unchanged voltage of the envelope.

3. The method of claim 2, wherein applying the envelope amplification process comprises:
   applying a linear envelope amplification process on the unchanged voltage of the envelope with reference to high supply voltage, the high supply voltage being greater than the threshold voltage.

4. The method of claim 1, wherein amplifying the shaped envelope comprises:
   responsive to the voltage of the envelope being below the threshold voltage, amplifying the shaped envelope by increasing the predefined low voltage to low supply voltage, the low supply voltage being below the threshold voltage.

5. The method of claim 4, wherein the predefined low voltage is zero voltage, and wherein the low supply voltage is greater than knee voltage of the RFPA.

6. The method of claim 4, wherein amplifying the shaped envelope comprises:
   responsive to the voltage of the envelope being below the threshold voltage, providing the low supply voltage directly to the RFPA.

7. The method of claim 1, further comprising:
   detecting a peak-to-average-power-ratio (PAPR) of the RF signal; and
   updating the threshold voltage at least in part based on the detected PAPR.

8. An apparatus comprising:
   an envelope shaping stage configured to:
   responsive to voltage of envelope of a radio frequency (RF) signal being greater than or equal to threshold voltage, shape the envelope by keeping the envelope unchanged, and
   responsive to the voltage of the envelope being below the threshold voltage, shape the envelope by replacing the voltage of the envelope with predefined low voltage, the predefined low voltage being below the threshold voltage; and
   an envelope amplification stage configured to amplify the shaped envelope, the amplified envelope provided to a radio frequency power amplifier (RFPA) for amplifying the RF signal.

9. The apparatus of claim 8, wherein the envelope amplification stage includes an envelope amplifier configured to, responsive to the voltage of the envelope being greater than or equal to the threshold voltage, apply an envelope amplification process on the unchanged voltage of the envelope.

10. The apparatus of claim 9, wherein the envelope amplifier includes a linear amplifier configured to apply a linear amplification process on the unchanged voltage of the envelope with reference to high supply voltage, the high supply voltage being greater than the threshold voltage.

11. The apparatus of claim 8, wherein the envelope amplification stage is configured to, responsive to the voltage of the envelope being below the threshold voltage, amplify the shaped envelope by increasing the predefined low voltage to low supply voltage, the low supply voltage being below the threshold voltage.

12. The apparatus of claim 11, wherein the predefined low voltage is zero voltage, and wherein the low supply voltage is greater than knee voltage of the RFPA.

13. The apparatus of claim 11, wherein the envelope amplification stage comprises a power switch configured to, responsive to the voltage of the envelope being below the threshold voltage, provide the low supply voltage directly to the RFPA.

14. The apparatus of claim 8, wherein the envelope shaping stage is further configured to update the threshold voltage based at least in part on a peak-to-average-power-ratio (PAPR) of the RF signal.

15. A supply modulator comprising:
   an input node;
   an output node;

a comparator coupled to the input node and having a voltage output, the comparator operable to:
  compare voltage of envelope of a radio frequency (RF) signal with threshold voltage, the envelope received from the input node,
  responsive to the voltage of the envelope being greater than or equal to the threshold voltage, provide the voltage of the envelope via the voltage output, and
  responsive to the voltage of the envelope being below the threshold voltage, provide constant low voltage via the voltage output;
an amplifier coupled between the comparator and the output node, the amplifier, when enabled, operable to amplify the voltage of the envelope received from the voltage output of the comparator;
a first switch coupled to the comparator and the amplifier, the first switch operable to enable or disable the amplifier based on the comparison by the comparator; and
a second switch coupled to the comparator, the amplifier and the output node, the second switch operable to connect, based on the comparison by the comparator, the output node to an output of the amplifier or low supply voltage, the low supply voltage being below the threshold voltage.

16. The supply modulator of claim 15, wherein the comparator further has a control output and operable to:
  responsive to the voltage of the envelope being greater than or equal to the threshold voltage, provide a first control signal to the first switch and the second switch via the control output; and
  responsive to the voltage of the envelope being less than the threshold voltage, provide a second control signal to the first switch and the second switch via the control output.

17. The supply modulator of claim 16, wherein the amplifier has a reference voltage input coupled to the first switch, and wherein the first switch is operable to:
  responsive to the first control signal, connect the reference voltage input to high supply voltage, the high supply voltage being greater than the threshold voltage; and
  responsive to the second control signal, connect the reference voltage input to ground.

18. The supply modulator of claim 16, wherein the second switch is operable to:
  responsive to the first control signal, connect the output node to the output of the amplifier; and
  responsive to the second control signal, connect the output node to the low supply voltage.

19. The supply modulator of claim 15, further comprising:
  a first switch driving stage coupled between the comparator and the first switch and operable to drive the first switch based on the comparison by the comparator; and
  a second switch driving stage coupled between the comparator and the second switch and operable to control the second switch based on the comparison by the comparator.

20. The supply modulator of claim 15, wherein the constant low voltage is zero voltage, and wherein the low power supply is greater than knee voltage of a radio frequency power amplifier (RFPA) coupled to the output node.

* * * * *